(12) United States Patent
Cheng et al.

(10) Patent No.: US 7,417,469 B2
(45) Date of Patent: Aug. 26, 2008

(54) COMPENSATION FOR LEAKAGE CURRENT FROM DYNAMIC STORAGE NODE VARIATION BY THE UTILIZATION OF AN AUTOMATIC SELF-ADAPTIVE KEEPER

(75) Inventors: Zhibin Cheng, Cary, NC (US); Aleksandr Kaplun, Whitsett, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/559,289

(22) Filed: Nov. 13, 2006

(65) Prior Publication Data

US 2008/0111616 A1    May 15, 2008

(51) Int. Cl.
H03K 19/20    (2006.01)
(52) U.S. Cl. ..................... 326/112; 326/119
(58) Field of Classification Search ............. 326/95–98, 326/112, 119, 121–122
See application file for complete search history.

(56) References Cited

U.S. PATENT DOCUMENTS

| | | | | |
|---|---|---|---|---|
| 6,844,750 B2 * | 1/2005 | Hsu et al. | ............ | 324/763 |
| 7,256,621 B2 * | 8/2007 | Lih et al. | ............ | 326/121 |
| 2002/0173090 A1 * | 11/2002 | Nakada et al. | ............ | 438/200 |
| 2005/0040857 A1 * | 2/2005 | Yoo | ............ | 326/95 |
| 2005/0083082 A1 * | 4/2005 | Olofsson | ............ | 326/95 |
| 2005/0104612 A1 * | 5/2005 | Hsu et al. | ............ | 324/763 |
| 2005/0214695 A1 * | 9/2005 | Lih et al. | ............ | 326/98 |

OTHER PUBLICATIONS

Author:Tamer Cakici and Kaushik Roy☐☐Title: Current Mirror Evaluation Logic: A New Circuit Style for High Fan-in Dynamic Gates☐☐Date: 2002☐☐Publisher: School of Electrical and Computer Engineering, Purdue University☐☐Pertinent pp. 395-398.*

\* cited by examiner

*Primary Examiner*—Rexford Barnie
*Assistant Examiner*—Thienvu V Tran
(74) *Attorney, Agent, or Firm*—Josh G. Cockburn; Dillon & Yudell LLP

(57) ABSTRACT

A method and system for automatically detecting and optimally compensating a wide range of die leakage currents in dynamic circuits is presented. A self-adaptive keeper tracks the leakage and reduces the leakage effects by optimally controlled compensation current. The self-adaptive keeper utilizes a 2-stage embedded current mirror circuit, a dummy cell and a keeper transistor to compensate leakage current. The load impact of the self-adaptive keeper on the dynamic circuit components (for example, the impact on memory cells) is minimized by a dummy cell which detects and matches the instant leakage current. Amplification in the 2-stage embedded current mirror circuit provides an optimal current strength in the keeper transistor. The optimally amplified leakage current is utilized to compensate for a leakage induced voltage drop at the circuit's output. Thus, the self-adaptive keeper ensures the robustness of the circuit in real time and does not create any negative trade-off on read latency.

4 Claims, 4 Drawing Sheets

COMPENSATION FOR LEAKAGE CURRENT FROM DYNAMIC STORAGE NODE VARIATION BY THE UTILIZATION OF AN AUTOMATIC SELF-ADAPTIVE KEEPER

BACKGROUND OF THE INVENTION

1. Technical Field

The present invention generally relates to integrated circuits and in particular to leakage current in integrated circuits. Still more particularly, the present invention relates to compensation of leakage current in integrated circuits.

2. Description of the Related Art

In Integrated circuit (IC) fabrication technology, lower threshold voltages and smaller transistor geometry result in higher leakage current, which is defined as the current passing through a transistor when it is turned off. Threshold voltage refers to the voltage at which transistors turn on. Leakage current consumes power and reduces standby time for portable devices that use battery power. Consequently, reducing leakage current without sacrificing too much performance is one of the major challenges in IC designs. Leakage current is more problematic as IC circuits become smaller. This is because leakage current increases at a high rate as transistor size decreases.

Increasing the sub-threshold leakage current with process scaling has forced designers to upsize the keeper (which provides a stabilizing effect) in dynamic circuits in order to achieve an acceptable robustness in the worst case leakage corner. Various studies have shown that there is a wide range of variation in die-to-die Negative Field Effect Transistor (NFET) leakage. This variation indicates that a large number of low leakage dies suffer from the performance loss due to an unnecessarily over sized keeper. Unfortunately, the excess leakage dies still do not satisfy the robustness requirements with a keeper sized for the faster corner leakage. This inability to satisfy performance requirements reveals the drawbacks of a conventional keeper used under a wide range of inter or intra-die variation.

A Process-Compensation-Dynamic (PCD) circuit technique has been proposed to improve overall robustness and delay variation spread by (a) restoring robustness of worst-case leakage dies and (b) improving performance of low-leakage dies. Unlike prior fixed-strength keeper techniques, the PCD circuit technique utilizes a programmable keeper, which is optimally programmed based on the respective die leakage. In the PCD implementation, a digitally programmable 3 bit keeper is applied on an 8-way register file's Local Bitline (LBL). Each of the three binary-weighted keepers, with respective widths W, 2 W and 4 W, may be activated or deactivated by asserting pre-coded 3-bit globally routed control signals. These global signals need to be incorporated with the die leakage statistics, and are incorporated with manually conducted off-line sampling and statistical procedures. Thus, the use of these globally-routed control signals is usually costly and time consuming.

SUMMARY OF THE INVENTION

Disclosed is a method and system for automatically detecting and optimally compensating a wide range of die leakage currents in dynamic circuits. A self-adaptive keeper tracks current leakage and reduces the leakage effects by optimally controlled compensation current. The self-adaptive keeper utilizes a 2-stage embedded current mirror circuit, a dummy cell and a self-adaptive keeper transistor to compensate leakage current. The load impact of the self-adaptive keeper circuitry on static and dynamic circuit components (such as, the impact on memory cells, for example) is minimized by the dummy cell. The dummy cell is essentially a leakage current monitor device, which detects and matches the instant leakage current from the dynamic circuit components. Leakage amplification by the 2-stage current mirror circuit provides an optimal current strength in the keeper transistor. The amplification level is determined by the size of the transistors within the leakage current path of the 2-stage current mirror circuit. In the pre-charge phase, the keeper transistor allows the passage of the amplified leakage current. This optimally amplified leakage current is utilized to compensate for a leakage induced voltage drop at the circuit's output. Thus, the self-adaptive keeper ensures the robustness of the circuit in real time.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method and system for automatically detecting and optimally compensating a wide range of die leakage currents in dynamic circuits. A self-adaptive keeper tracks current leakage and reduces the leakage effects by optimally controlled compensation current. The self-adaptive keeper utilizes a 2-stage embedded current mirror circuit, a dummy cell and a self-adaptive keeper transistor to compensate leakage current. The load impact of the self-adaptive keeper circuitry on static and dynamic circuit components (such as, the impact on memory cells, for example) is minimized by the dummy cell. The dummy cell is essentially a leakage current monitor device, which detects and matches the instant leakage current from the dynamic circuit components. Leakage amplification by the 2-stage current mirror circuit provides an optimal current strength in the keeper transistor. The amplification level is determined by the size of the transistors within the leakage current path of the 2-stage current mirror circuit. In the pre-charge phase, the keeper transistor allows the passage of the amplified leakage current. This optimally amplified leakage current is utilized to compensate for a leakage induced voltage drop at the circuit's output. Thus, the self-adaptive keeper ensures the robustness of the circuit in real time.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

It is also understood that the use of specific parameter names are for example only and not meant to imply any limitations on the invention. The invention may thus be implemented with different nomenclature/terminology utilized to describe the above parameters, without limitation. Also, to differentiate among similar circuit components, the terms first and second and primary and secondary are utilized within the description and claims. The use of these terms is not meant to imply any hierarchical distinctions (numerical or other wise) on the specific component(s), and the terms are provided solely for clarity in describing the various similar components.

Figure 1:
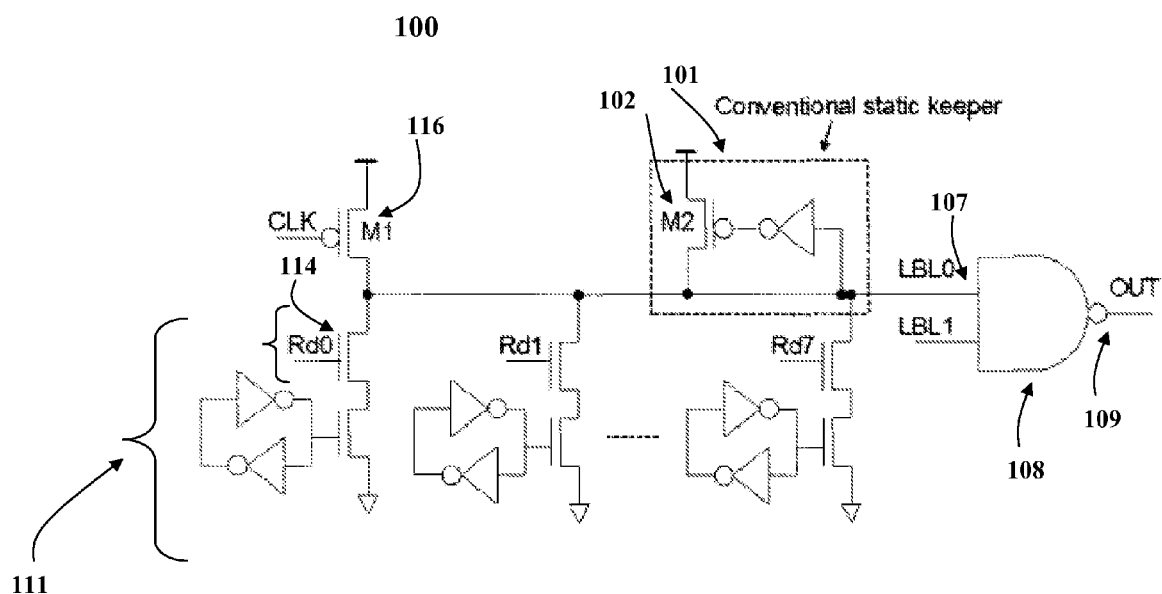
FIG. 1 illustrates a conventional fixed-strength keeper used for leakage current compensation, according to the prior art.

With reference now to the figures, FIG. 1 illustrates a conventional fixed-strength keeper used for leakage current compensation in an integrated circuit, according to the prior art. Circuit 100 comprises static keeper 101, which includes (switching) PFET transistor (M2) 102. Circuit 100 also comprises memory load 111, which is an 8-way dynamic register file, with each way having a primary NFET 114 and additional circuitry (not specifically referenced). Circuit 100 further comprises input Positive Field Effect Transistor (PFET) 116 and output NAND gate 108, which provides output 109. Input PFET 116 has a clock input (CLK) coupled to base terminal of input PFET M1 115. Output NAND gate 108 has two input signal paths, LBL0 107 and LBL1. LBL refers to Local Bitline. LBL0 107 provides a connection node at which is connected the source terminals of each primary NFET 114, drain terminal of input PFET M1 116, and drain terminal of PFET (M2) 102 within static keeper 101.

In operation of circuit 100, static keeper 101 is used at the LBL0 node of the dynamic register file (memory load 111) for leakage compensation on dynamic node LBL0 107. In Circuit 100, switching on input PFET M1 116 charges up input signal path (or wired node) LBL0 107 to high in the pre-charge phase. The input signal path, LBL0 107, has 8-way memory load 111 connected by primary NFETs 114. When LBL0 107 is charged to high, current leakage occurs in all of the NFET memory paths. Static keeper 101 is used to provide a path for the current to charge up node LBL0 107 in an effort to compensate the leakage induced voltage drop, because the leakage directly affects the robustness of the circuit. Static keeper 101 works when the leakage variation is minimal, but does not work well as the leakage variation gets larger. Further, because of the fixed strength of the compensation associated with static keeper 101, static keeper 101 does not work well when static keeper 101 is required to balance the read delay and robustness requirements.

Figure 2:
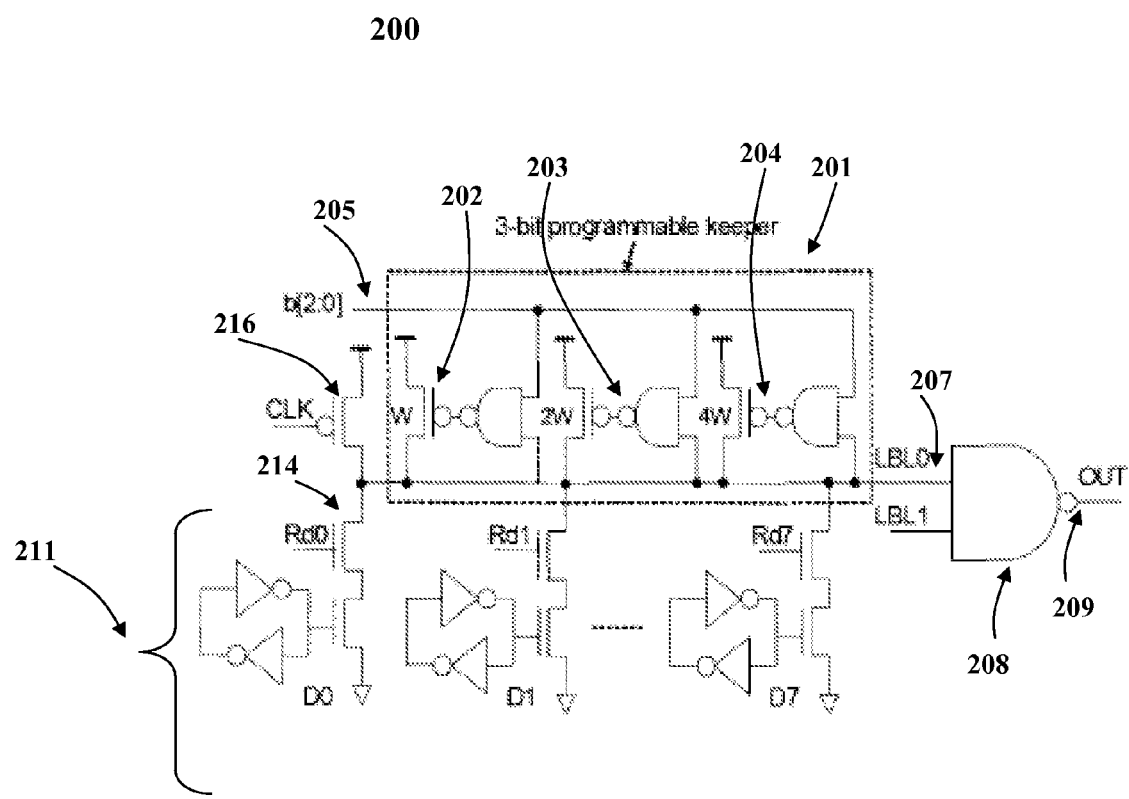
FIG. 2 illustrates a digital programmable keeper used for leakage current compensation, according to the prior art.

FIG. 2 illustrates a digital programmable keeper used for leakage current compensation in an integrated circuit, according to the prior art. Circuit 200 comprises 3-bit keeper 201, which includes first binary keeper 202, second binary keeper 203, and third binary keeper 204. Three-bit keeper includes an input control signal terminals (b[2:0]) 205. Similar to circuit 100 of FIG. 1, circuit 200 also comprises an 8-way dynamic register file, memory load 211, which is connected at the source of primary NFETs (Rd0: Rd7) 214 to input signal path, LBL0 207, of output NAND gate 208. Output NAND gate 208 has two input signal paths, LBL0 207 and LBL1 and provides output 209. Input PFET 216 has a clock input (CLK) coupled to its base terminal. Each binary keeper 202, 203, 204 of 3-bit keeper 201 is also connected to LBL0 207.

In Circuit 200, a digital programmable keeper (3-bit keeper 201) that has limited discrete values of strength is utilized for process variation compensation. The approach to leakage current compensation illustrated in Circuit 200 is referred to as the Process-Compensation-Dynamic (PCD) circuit technique. By replacing the conventional keeper in Circuit 100 with 3-bit programmable keeper 201, the enhanced circuitry of Circuit 200 is realized. Three-bit programmable keeper 201 consists of three binary-weighted keepers (first binary keeper 202, second binary keeper 203, and third binary keeper 204) with respective widths W, 2 W and 4 W. These individual keepers may be activated or deactivated by pre-coded 3-bit globally routed control signal inputs provided at input terminals b[2:0] 205. Further, these control signals may be determined by the die leakage statistics. Studies show that excess dynamic node capacitance on LBL0 of the PCD scheme causes a 7% LBL delay penalty. However this penalty is offset by the (reported) speedup achieved by keeper downsizing on low leakage dies.

Figure 3:
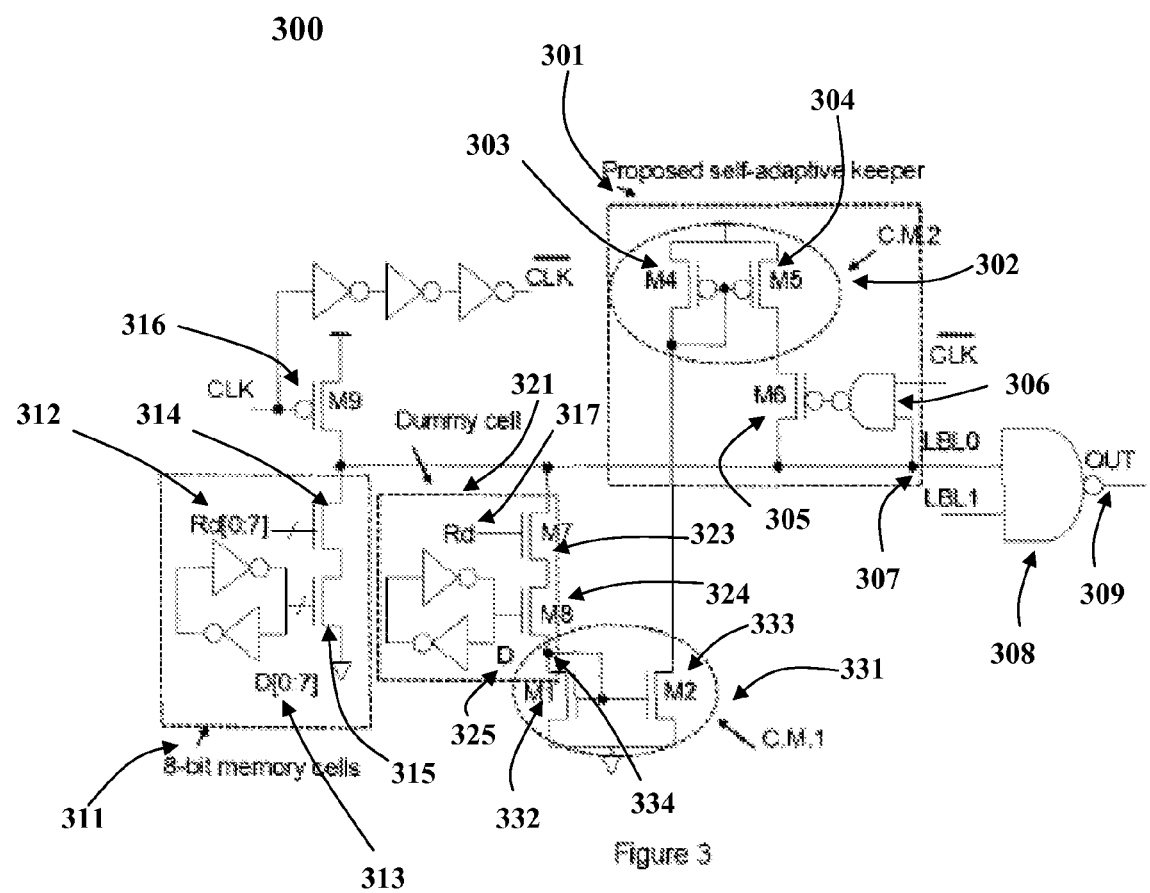
FIG. 3 illustrates an automatic self-adaptive keeper used for leakage current compensation, according to an illustrative embodiment.

FIG. 3 illustrates an automatic self-adaptive keeper used for leakage current compensation in an integrated circuit, according to an illustrative embodiment. Integrated circuit (IC) 300 comprises memory load 311, which is an 8-way dynamic register file (8-bit memory cells), with each way having primary NFET 314, secondary NFET 315 and additional registry circuitry (as illustrated), not specifically relevant to the invention. In IC 300, memory cells 311 comprise read inputs Rd[0:7] 312, which are inputs to the controlling gates of primary NFETs 314. Memory cells 311 also comprises states D[0:7] 313, which represents inputs to the controlling gates of the secondary NFETS 315.

IC 300 further comprises input PFET (M9) 316 and output NAND gate 308, which provides output 309. Input PFET 316 has a clock input (CLK) coupled to base terminal of input PFET 315. Output NAND gate 308 has two input signal paths, LBL0 307 and LBL1, where LBL refers to Local Bitline. LBL0 307 is a wired signal path, which provides a connection node at which is connected the source terminals of each primary NFET 314 of memory load 311, drain terminal of input PFET 316, source terminal of primary NFET (M7) 323 of dummy memory cell 321 (described below), and source terminal of feedback PFET transistor (M6) 305 within self-adaptive keeper 301, which is now described.

Switching on input PFET 316 charges up input signal path (or wired node) LBL0 307 to high in the pre-charge phase. The input signal path, LBL0 307, has 8-way memory load 311 connected by primary NFETs 314. When LBL0 307 is charged to high, current leakage occurs in all of the NFET memory paths.

In order to reduce the effects of leakage current during operation of memory load 311 within IC 300, IC 300 is enhanced with the addition of three circuit sub-systems, namely, self adaptive keeper 301, dummy memory cell 321, and stage one current mirror (C.M.1) 331. Self-adaptive keeper 301 includes stage two current mirror (C.M.2) 302, which comprises two PFETs, first PFET (M4) 303 and second PFET (M5) 304, coupled at their respective source terminals to a common node. First PFET 303 and second PFET 304 are also connected gate-to-gate, with the gate terminals tied to the drain terminal of first PFET 303. Drain terminal of second PFET 304 is coupled to the drain terminal of feedback PFET (M6) 305, which has its gate terminal connected to the output of feedback NAND gate 306. Both the source terminal of feedback PFET 305 and first input terminal of feedback NAND gate 306 are connected to LBL0 307 at a point at which LBL0 307 enters output NAND gate 308.

Drain terminal of first PFET 303 is coupled to source terminal of second mirrored NFET (M2) 333 within stage one current mirror 331. First mirrored NFET (M1) 332 of stage one current mirror 331 is coupled to second mirrored NFET 333 in a configuration that represents a mirror image of the PFETS within stage two current mirror 302 (or vice versa). However, the source terminals are connected to a common ground node, while the drain node of first mirrored NFET 332 is connected to dummy cell 321. In stage one current mirror 331, the source of NFET transistor (M1) 332 is connected at node 334 to the drain of M8 324 (of dummy cell 321). Thus, node 334 connects stage one current mirror 331 to a dummy leakage path. Both of the controlling gate terminals of first mirror NFET (M1) 332 and second mirror NFET (M2) 333 are also connected to node 334.

Dummy cell 321 comprises similar components, which are similarly configured as each of the 8-bit memory cells of memory load 311. Specifically, dummy cell 321 comprises primary NFET (M7) 323 coupled to secondary NFET (M8) 324, and other memory components, not relevant to the invention. It should be noted, that the dummy cell may vary depending on the load that is actually applied within the IC, such that the dummy cell always provides a similar loading as one of the "cells" within the provided load. Source terminal of primary NFET (M7) 322 is also coupled to LBL0 307. Drain terminal of secondary NFET (M8) 324 is coupled to the drain of first mirrored NFET (M1) 332 and to the bases of both first mirrored NFET (M1) 332 and second mirrored NFET (M2) 333.

According to the invention, LBL0 307 represents a dynamic output node, with varying current flow and resulting voltage changes. In operation and using the interconnected stage one current mirror 331 and stage two current mirror 302, IC 300 provides a 2-stage current mirror, wherein stage two current mirror 302 is included within self-adaptive keeper 301. Output from the memory cells of memory load 311 are received from the source terminals of NFETs 314 along wired path LBL0 307.

Self adaptive keeper 301 provides a feedback loop from LBL0 307, which loop includes stage one current mirror 331, feedback PFET (M6) 305 and feedback NAND gate 308, all within self-adaptive keeper 301. Feedback PFET 305 is placed in the slave path of stage two current mirror 302. Feedback NAND gate 306 receives a delayed clock input (CLK bar), which is a delayed version of input clock received at input PFET (M9) 316. The output of NAND gate 306 is connected to the controlling gate of feedback PFET 305 in self-adaptive keeper 301.

In IC 300, during the pre-charge phase, leakage current flows from NFETs in the memory cells of memory load 311. Dummy cell 321 has a similar configuration to and has the same size components as a regular memory cell in memory load 311. Dummy cell 321, which is essentially a leakage current monitoring device, detects and matches the instant leakage current in these memory cells (of memory load 311. Dummy cell 321 enables minimization of the load impact of the additional circuitry (in IC 300) on memory load 311.

Self-adaptive keeper 301 is utilized for the automatic and optimal compensation of the leakage current from the NFETs, ensuring the robustness of IC 300. The 2-stage current mirror circuit detects, translates, and amplifies the instant leakage current from dummy cell 321 (which matches the leakage current in the 8-way memory cells of memory load 311). The amplified leakage current passes through feedback PFET 305 in the pre-charge phase to charge up node voltage on LBL0 307, compensating for a leakage induced voltage drop along the wired path (generally represented as LBL0 307).

In IC 300, when clock signal CLK 316 becomes low and while none of the read signals Rd[0:7] 312 are pulsed to high, PFET (M9) 315 is turned on. Read signal (Rd) 317 is always set to low in dummy cell 321. This first sequence of events ensures that NFET (M7) 323 and corresponding primary NFETs 314 in 8-way cells of memory load 311 are turned off. NFET (M8) 324 and corresponding secondary NFETs 315 in 8-way cells of memory load 311 are controlled by state D 325 and states D[0:7] 313, respectively.

The leakage current goes through all the NFET paths regardless of the values of the states; However, a "1" state allows a higher level of leakage. The leakage at the NFET path in dummy cell 321 is detected by stage one current mirror 331 and is then translated through the 2-stage current mirror circuit. The leakage current is amplified to a level based on the total leakage in the 8-way memory cells of memory load 311. The leakage amplification is determined by the size of the transistors within the current path of the 2-stage current mirror circuit.

Feedback PFET (M6) 305 is used to reduce the leakage (effects) in the pre-charge phase. In operation, feedback PFET (M6) 305 is switched by a feedback signal from LBL0 307 through clock controlled feedback NAND gate 306, so that feedback PFET (M6) 305 opens only in the pre-charge phase. Leakage amplification is required to provide an optimal current strength in feedback PFET (M6) 305, and the current strength is ultimately used for stabilizing the voltage across the dynamic node of LBL0 307. The optimally amplified leakage current passes through feedback PFET 305 in the pre-charge phase to charge up node LBL0 307, compensating for a leakage induced voltage drop at node LBL0 307.

Figure 4:
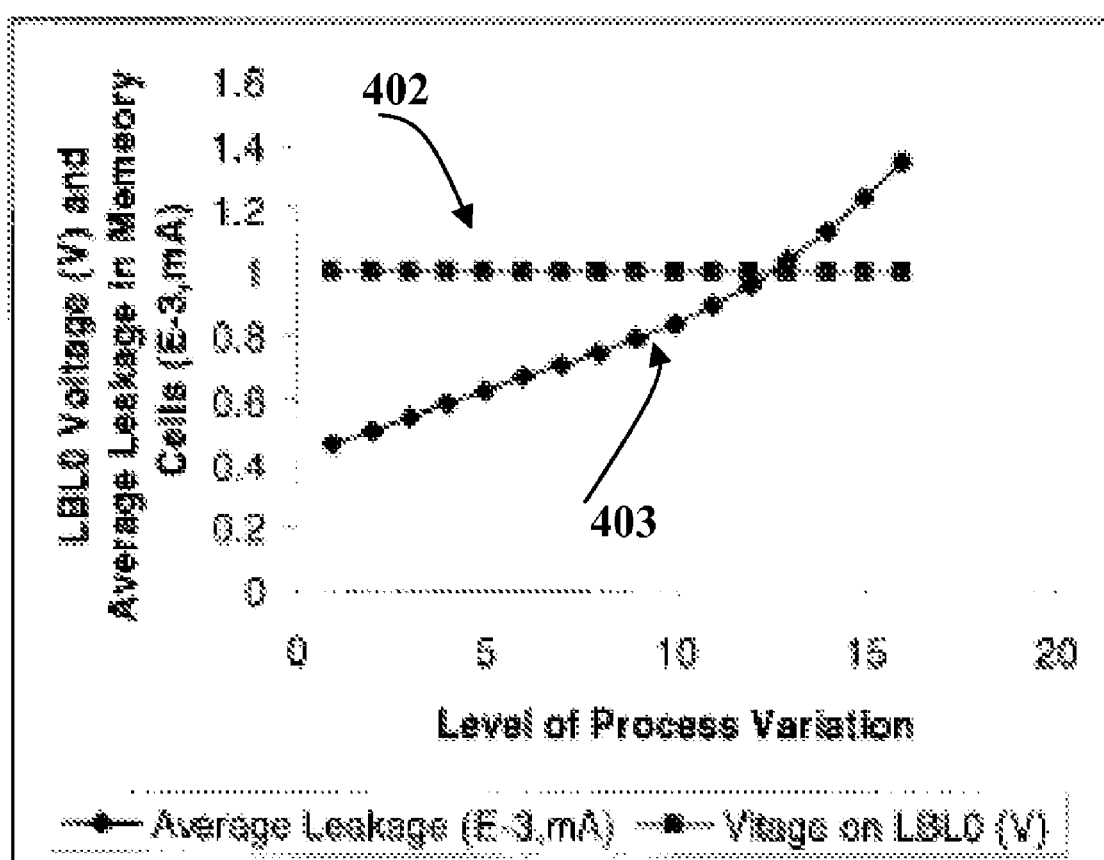
FIG. 4 is a waveform illustrating the simulation results of the self-adaptive keeper system under a wide range of leakage current variation.

FIG. 4 is a waveform illustrating the simulation results of the self-adaptive keeper system (shown in FIG. 3) under a wide range of leakage current variation. The process variation tolerant technique is applied on an 8-way dynamic register using the International Business Machines (IBM) 65-nm, partial depletion (PD), Silicon-on-insulator (SOI) technology with a power supply Vdd=1.0 volt. The proposed circuits are simulated under a wide range of leakage variation to examine the robustness and performance. To generate a wide range of leakage in order to mimic the process variation, the circuit under test is stimulated with a series of different inputs at Rd[0:7] 312 and Rd 322. The voltage level of these inputs (Rd[0:7] 312 and Rd 322) ranges from zero to well above the voltage threshold of transistor (M7) 323 in FIG. 3.

The simulation results of circuit robustness are depicted in FIG. 4, which shows a strong process variation tolerant behavior of the 8-way dynamic register file under a wide range of leakage variation condition, where the leakage ranges from 0.0004 mA to 0.00160 mA, plotted on the Y axis. The leakage current plot is shown as leakage 403. The dynamic node LBL0 stays firm at the "high" voltage level during pre-charge phase with a minimal disturbance that is less than 0.5% of the power supply voltage. The LBL0 voltage waveform is shown as LBL0 402.

In these simulations, a voltage represented by a digital "1 stored in one of the memory cells is read in response to the pulse signal Rd when the clock is high, and the delay is recorded and compared with a conventional dynamic register file with static keeper 101. The results show a great improvement in read delay for the register file compared to the conventional one. In average, the register file has greater than 50% read delay improvement, spreading a wide range of leakage variations, from 0.0004 mA to 0.00140 mA. Reasons for the read delay improvement include (a) the self-adaptive process variation tolerant technique does not require an exceeded capacitance load on dynamic node of LBL0 307 and (b) the self-adaptive keeper (present embodiment) stops compensating the dynamic node when the clock is high, but the conventional keeper compensates the node all the time, which causes additional read delay.

A process variation tolerant technique that utilizes a self-adaptive keeper based on the real time die leakage detection and amplification offers much higher LBL performance and circuit robustness than both conventional static keeper and programmable keeper schemes. The self-adaptive keeper also provides a great advantage in terms of the work load and cost efficiency.

While the invention has been particularly shown and described with reference to a preferred embodiment, it will be understood by those skilled in the art that various changes in form and detail may be made therein without departing from the spirit and scope of the invention.

What is claimed is:

1. A method for automatically detecting and optimally compensating a wide range of die leakage currents in dynamic circuits, said method comprising:

coupling an automatic self-adaptive keeper to a Local Bit-line (LBL) of an N-way register;

coupling a dummy cell to the LBL, wherein the dummy cell is similarly configured to one way of the N-way register file:

connecting a stage one current mirror (CM1) having CM1 transistors communicatively connected in a first configuration between the dummy cell and the self adaptive keeper;

detecting current leakage from the N-way register file on the LBL using the dummy cell, wherein the dummy cell matches the leakage current detected on the LBL;

reducing the leakage current effects by providing optimally controlled compensation current from the automatic self adaptive keeper;

wherein the automatic self adaptive keeper comprises:

a stage two current mirror (CM2) having CM2 transistors communicatively connected in a second configuration, relative to each other, which second configuration is similar to the first configuration, and wherein a drain of a first CM2 transistor within the stage two current mirror is coupled to a drain of a first CM1 transistor within the stage one current mirror;

wherein the stage two current mirror operates in combination with the stage one current mirror to provide a two-stage current mirror;

a feedback transistor connected at its drain to the LBL and at its source to the stage two current mirror; and a feedback (clock-controlled) NAND gate having a first input terminal that is connected to the LBL and a second input that is coupled to a delayed clock input, which is a delayed version of an input clock signal, wherein the feedback NAND gate further provides a NAND output that is connected to a gate terminal of the feedback transistor.

2. The method of claim 1, further comprising:

detecting the leakage current within the dummy cell using the stage one current mirror;

translating the leakage current at the stage one current mirror;

amplifying the leakage current detected from the dummy cell utilizing the two-stage current mirror.

3. The method of claim 2, further comprising:

passing the amplified leakage current through the feedback transistor during a pre-charge phase to charge up a node voltage along the LBL and compensate for a leakage induced voltage drop along the wire path.

4. A method for automatically detecting and optimally compensating a wide range of die leakage currents in dynamic circuits, said method comprising:

coupling an automatic self-adaptive keeper to a Local Bit-line (LBL) of an N-way register file;

coupling a dummy cell to the LBL, wherein the dummy cell is similarly configured to one way of the N-way register file;

connecting a stage one current mirror between the dummy cell and the self adaptive keeper;

detecting current leakage from the N-way register file on the LBL using the dummy cell, wherein the dummy cell matches the leakage current detected on the LBL;

reducing the leakage current effects by providing optimally controlled compensation current from the automatic self adaptive keeper;

mirroring the leakage current at the LBL in the dummy cell;

detecting the leakage within the dummy cell using the stage one current mirror;

translating the leakage current detected at the stage one current mirror through a two-stage current mirror circuit, which includes the stage one current mirror and a stage two current mirror within a self-adaptive keeper; and amplifying the leakage current to a level based on the total leakage in the N-way register file, wherein the leakage amplification is determined by the size of the transistors within the current path of the two-stage current mirror.

* * * * *